United States Patent [19]

Eden et al.

[11] Patent Number: 5,620,916
[45] Date of Patent: Apr. 15, 1997

[54] METHOD FOR IMPROVING VIA/CONTACT COVERAGE IN AN INTEGRATED CIRCUIT

[75] Inventors: Shmuel Eden; Yosi Amir, both of Haifa, Israel

[73] Assignee: Intel Corporation, Santa Clara, Calif.

[21] Appl. No.: 428,393

[22] Filed: Apr. 24, 1995

Related U.S. Application Data

[63] Continuation of Ser. No. 53,604, Apr. 27, 1993, abandoned.

[51] Int. Cl.$^6$ ............................................. H01L 21/768
[52] U.S. Cl. .............................................. 364/491; 438/599
[58] Field of Search ............................... 437/51; 364/491

[56]         References Cited

U.S. PATENT DOCUMENTS

| | | | |
|---|---|---|---|
| 3,983,619 | 10/1976 | Kubo et al. | 437/51 |
| 4,295,149 | 10/1981 | Balyoz | 437/51 |
| 4,319,396 | 3/1982 | Law et al. | 437/45 |
| 4,380,866 | 4/1983 | Countryman, Jr. et al. | 437/48 |
| 4,691,434 | 9/1987 | Percival et al. | 437/51 |
| 4,870,598 | 9/1989 | Shaw et al. | 364/491 |
| 4,910,162 | 3/1990 | Yasaka et al. | 437/48 |

FOREIGN PATENT DOCUMENTS

| | | | |
|---|---|---|---|
| 0049671 | 3/1985 | Japan . | |
| 0062162 | 4/1985 | Japan . | |
| 0126641 | 5/1990 | Japan | 437/919 |

*Primary Examiner*—Tom Thomas
*Attorney, Agent, or Firm*—Blakely, Sokoloff, Taylor & Zafman

[57]         ABSTRACT

A method of improving via/contact coverage in an integrated circuit. A standard layout of an interconnect layer comprising plurality of interconnect lines is initially generated with well-known techniques. After generation of the initial layout, the amount of overlap of at least one via by an interconnect line is optimized by increasing the amount of overlap of each side of the via by the interconnect line wherever possible without violating a minimum line separation requirement.

7 Claims, 9 Drawing Sheets

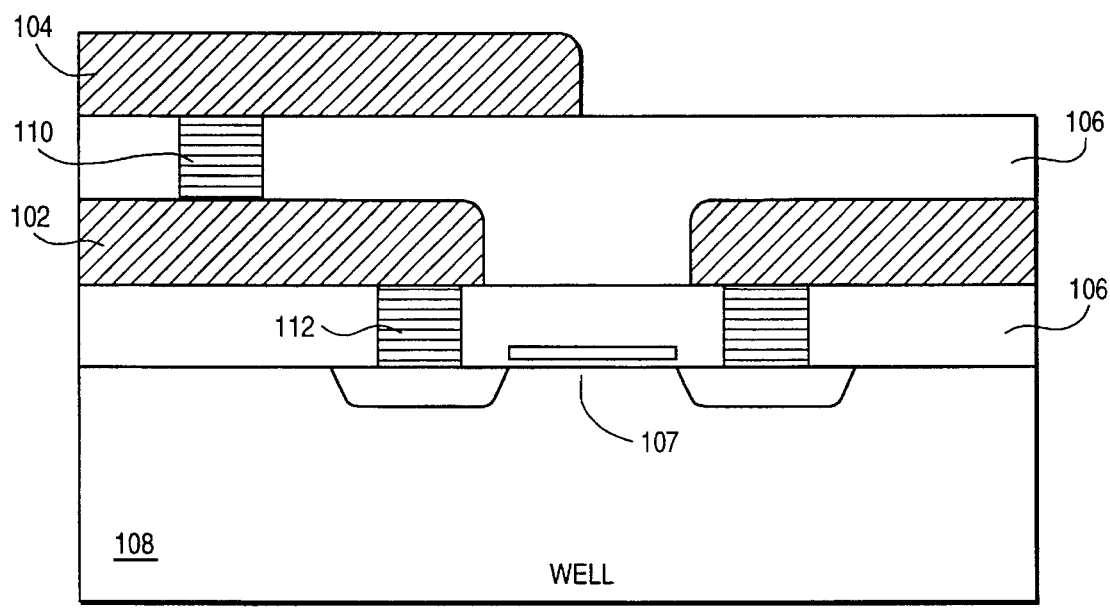
FIG_1

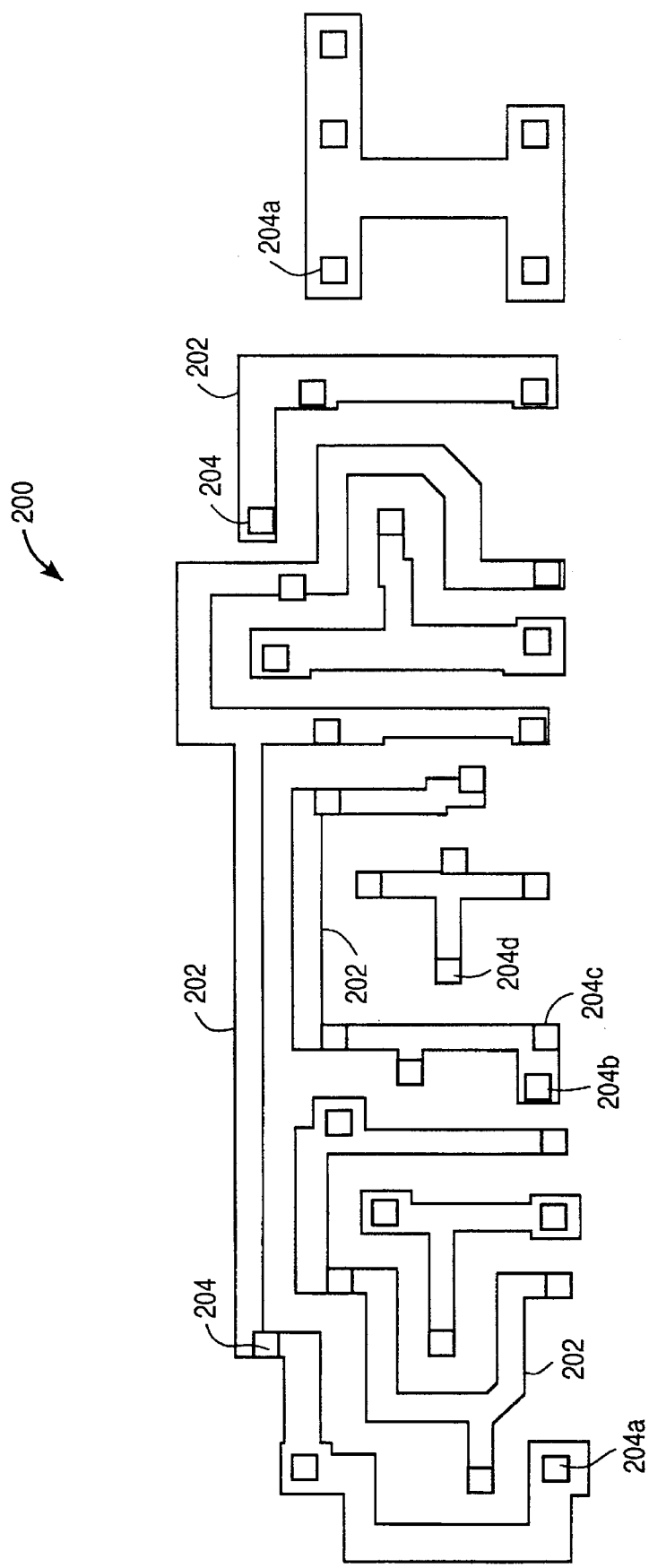
FIG._2 (PRIOR ART)

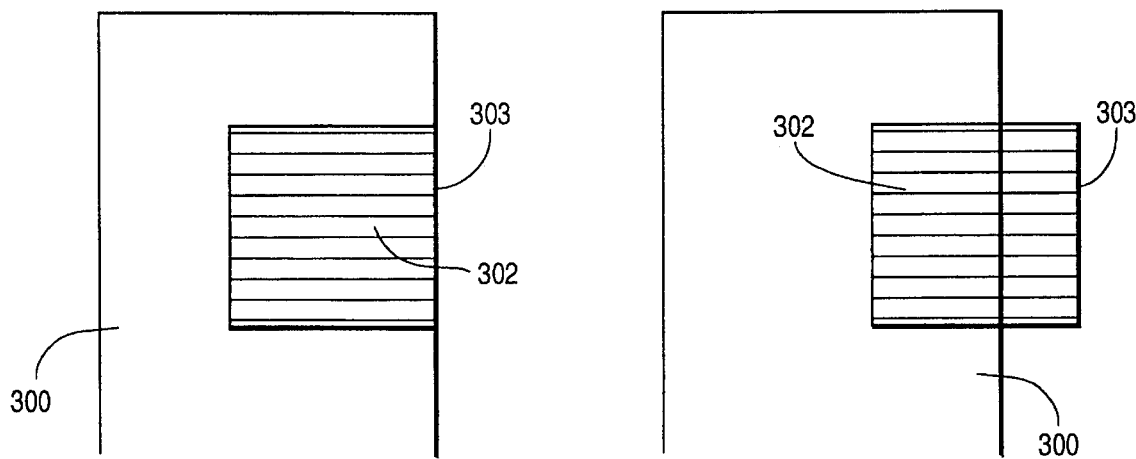
FIG_3A
(PRIOR ART)
FIG_3B
(PRIOR ART)
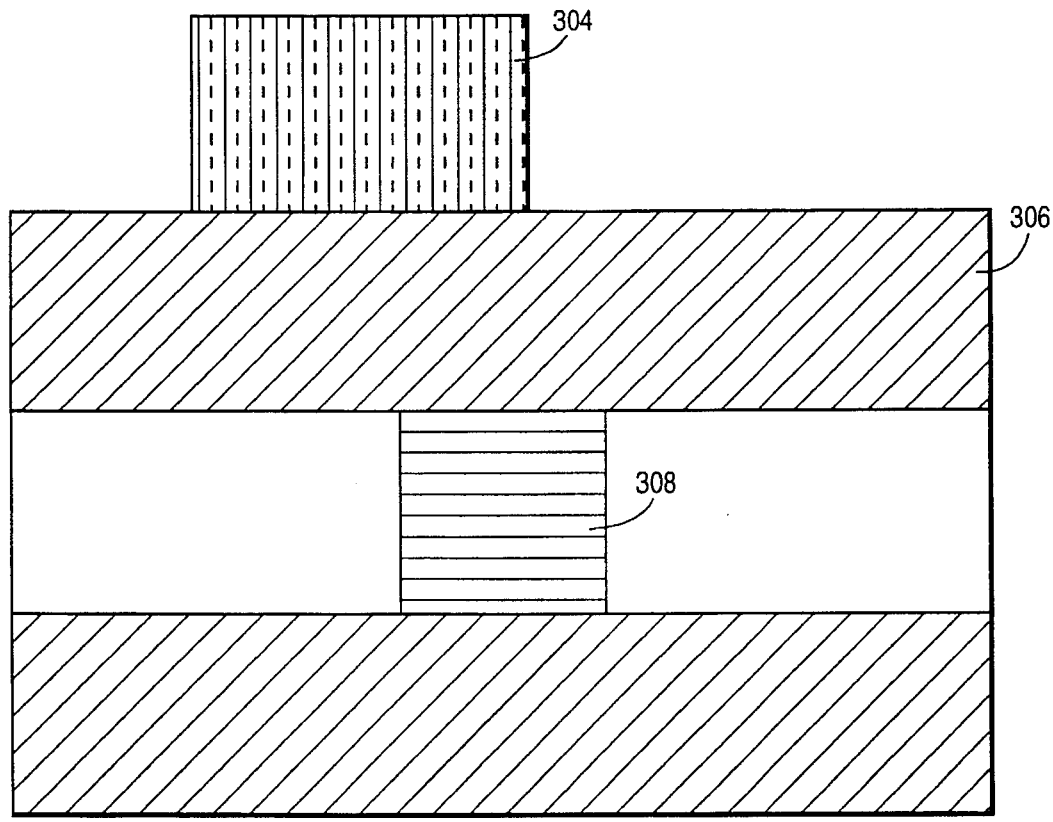
FIG_3C
(PRIOR ART)

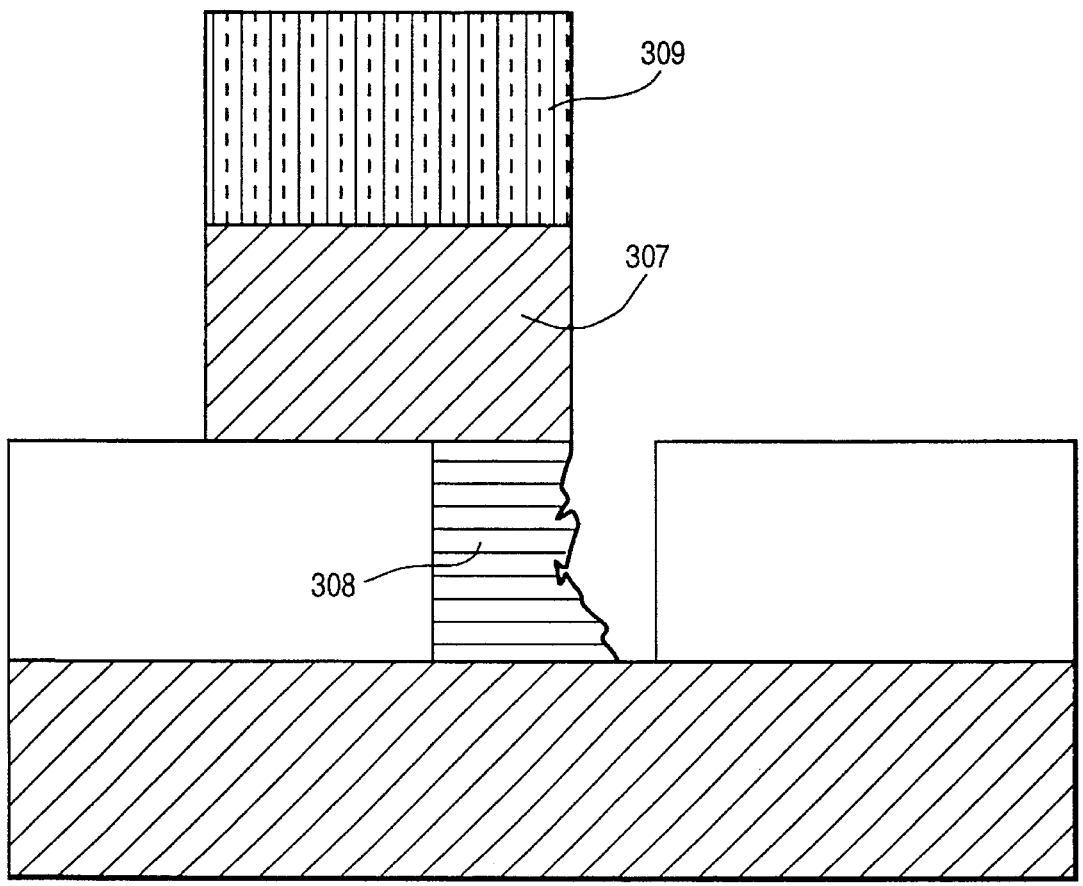
FIG_3D (PRIOR ART)

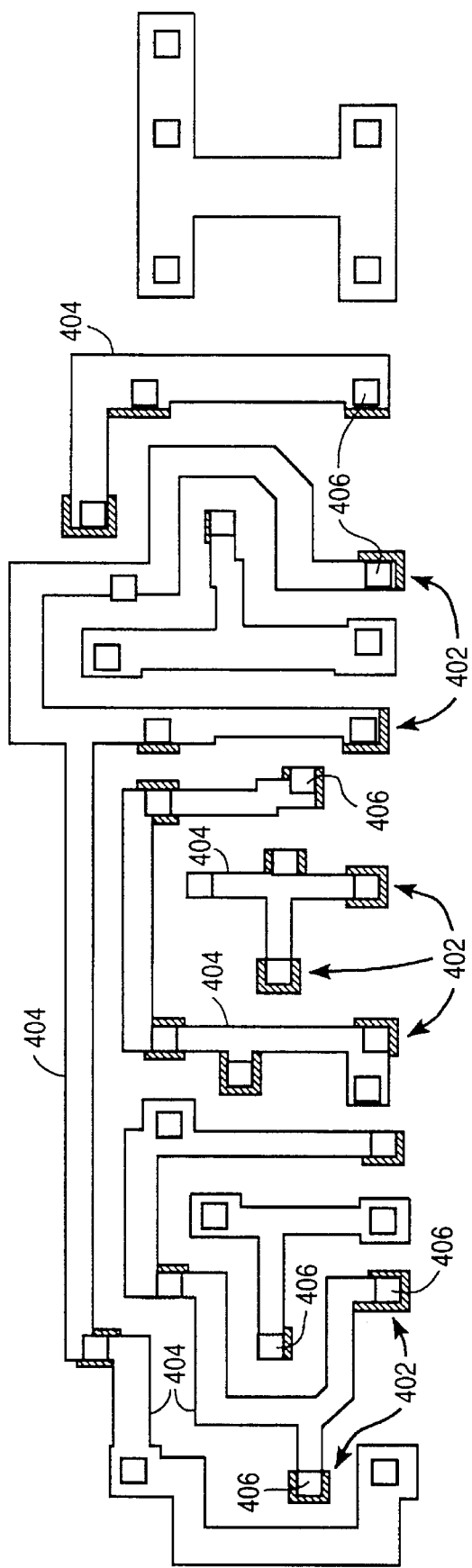

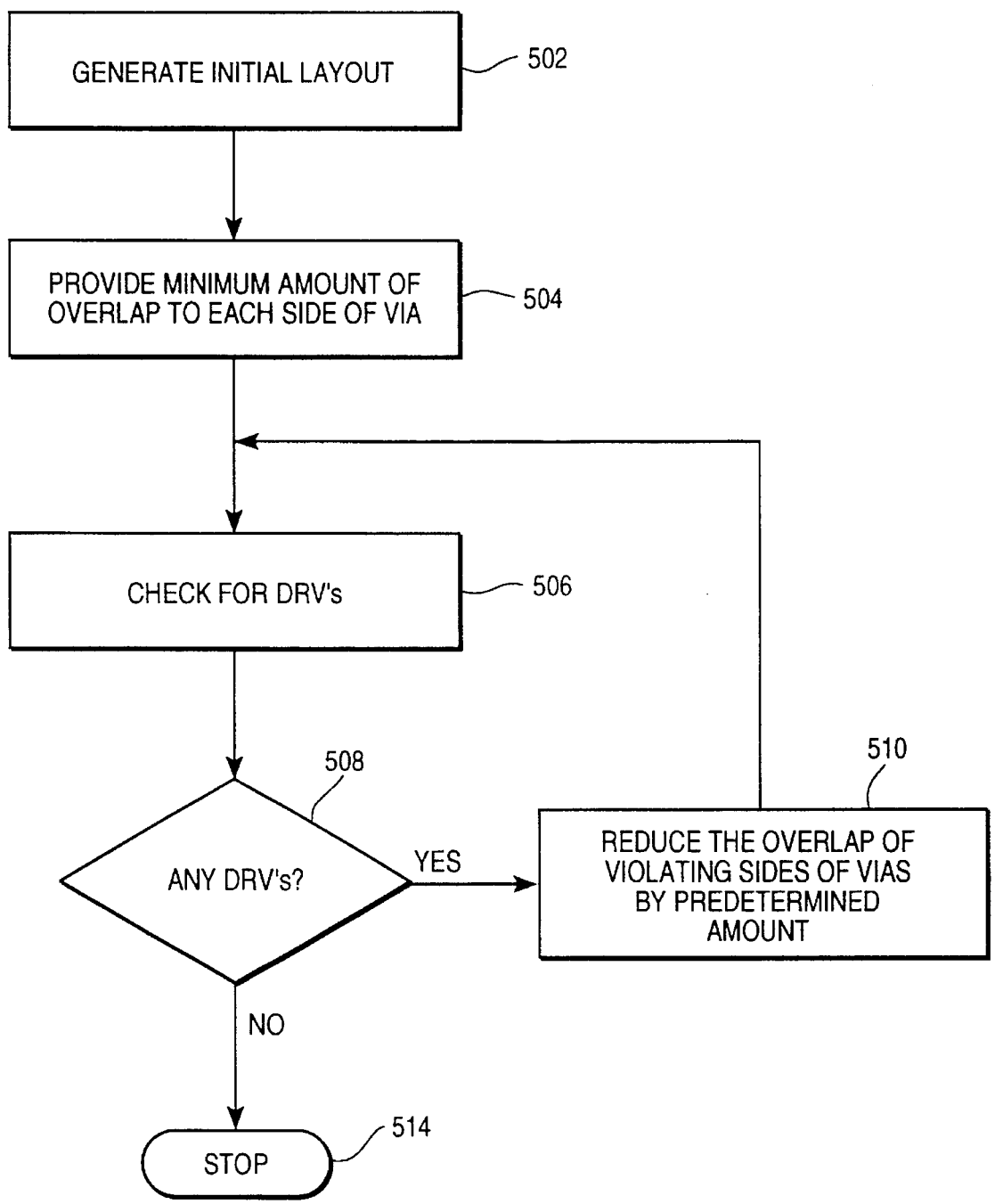
FIG_5

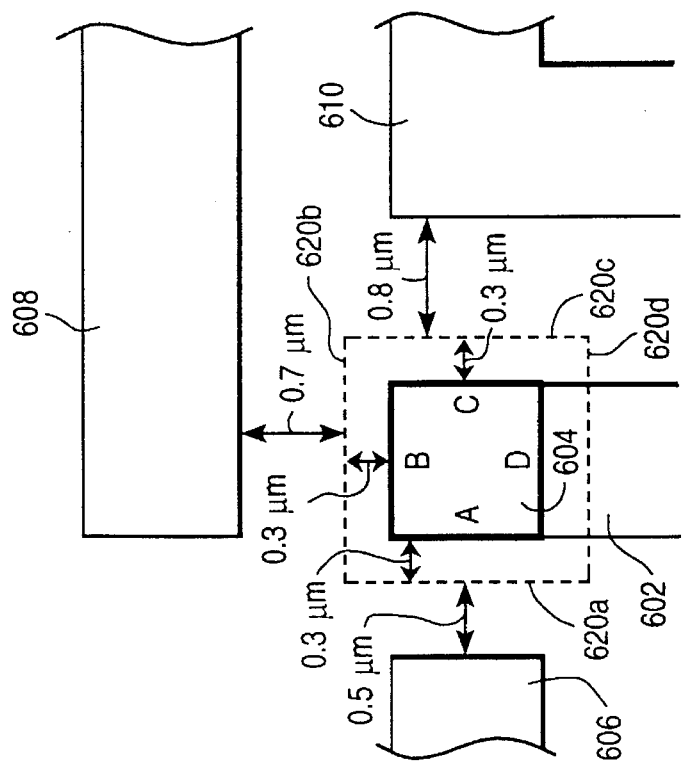
FIG_6B
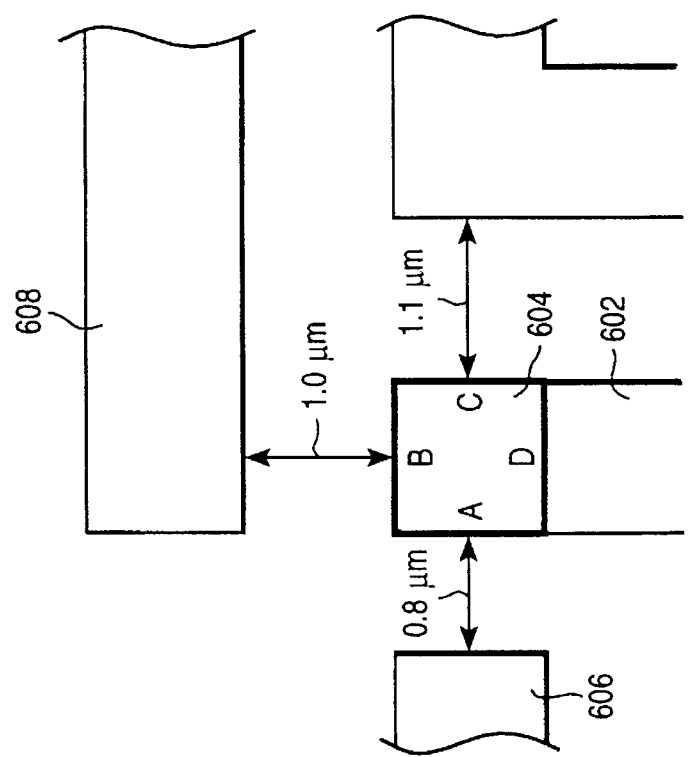
FIG_6A

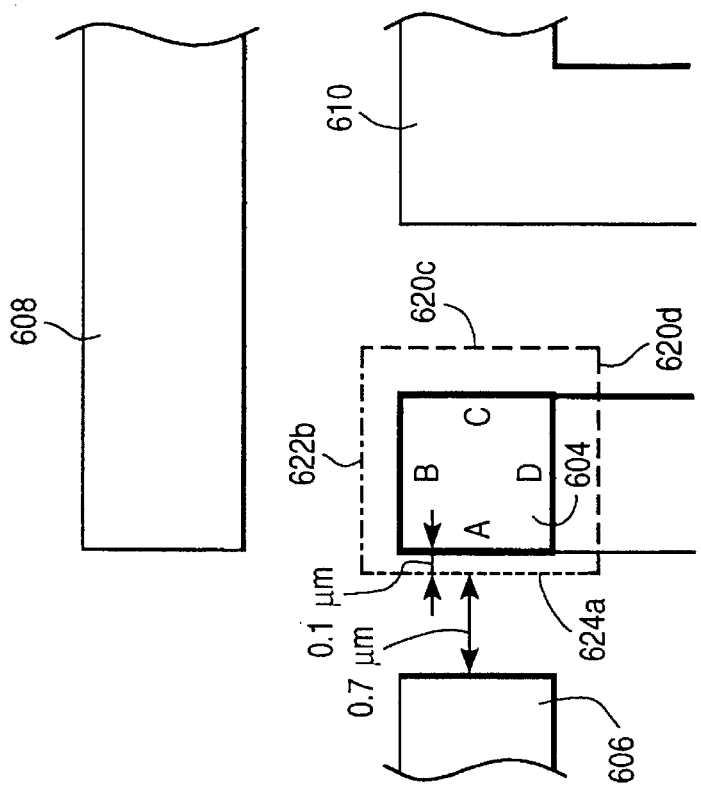
FIG_6D
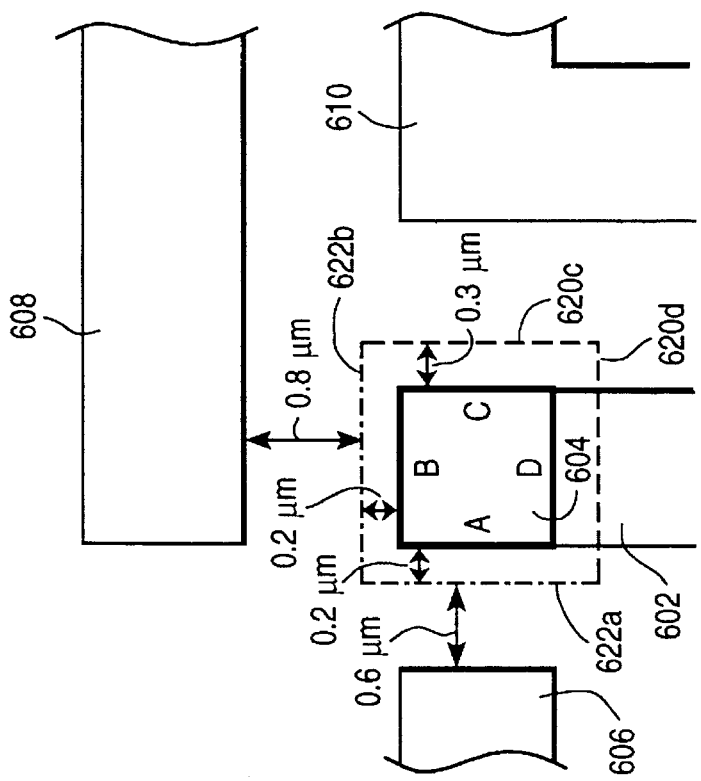
FIG_6C

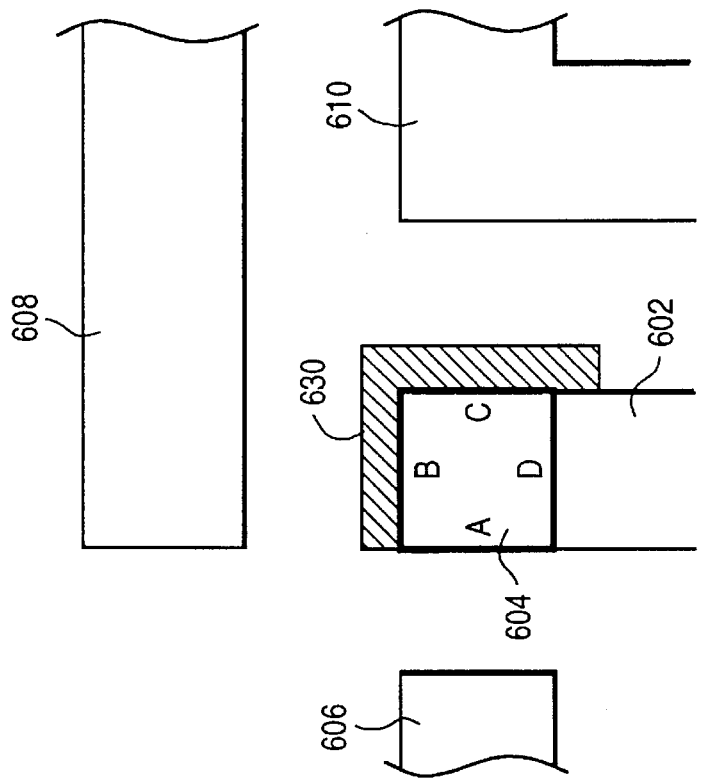
FIG_6F
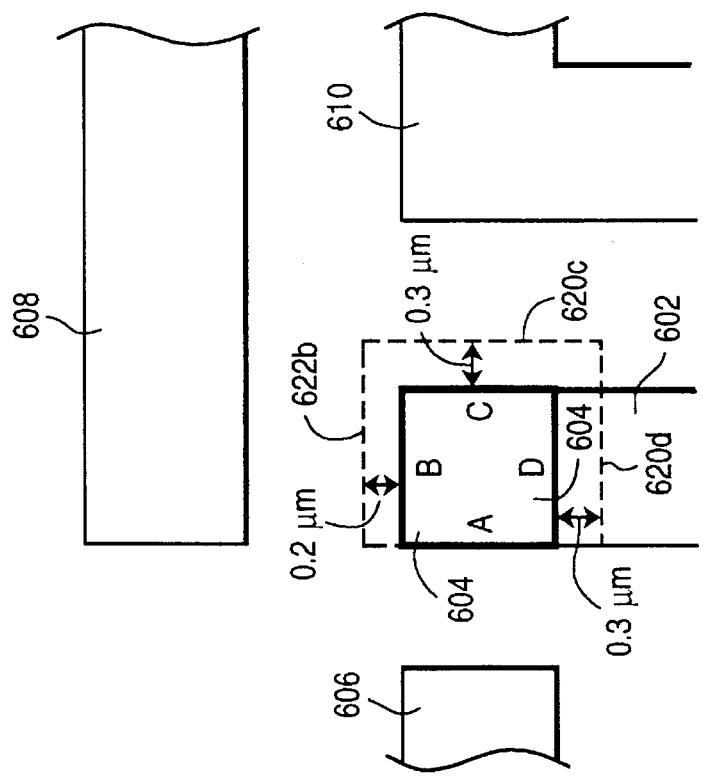
FIG_6E

METHOD FOR IMPROVING VIA/CONTACT COVERAGE IN AN INTEGRATED CIRCUIT

This is a continuation of application Ser. No. 08/053,604, filed Apr. 27, 1993 now abandoned.

BACKGROUND OF THE INVENTION

1. Field of the Invention

The present invention relates to the field of integrated circuit fabrication, and more specifically, to a method of improving via contact coverage in an integrated circuit.

2. Description of Relevant Art

Integrated circuits are made up of literally millions of active devices formed in or on a silicon substrate or well. The active devices are interconnected together in order to form functional circuits and components from the devices. The devices are interconnected together through the use of multi-level interconnects. A cross-sectional illustration of a typical multilevel interconnect is shown in FIG. 1. Interconnect structures normally have a first level of metalization or interconnect layer 102 (typically aluminum alloys or tungsten), a second level of metalization 104, and sometimes a third or even fourth level of metalization. Interlevel dielectrics 106 (ILD's) such as silicon dioxide ($SiO_2$) are used to electrically isolate different levels of metalization and the silicon substrate or well 108. The electrical connections between different interconnect levels are made through the use of metalized vias 110 formed in ILD 106. In a similar manner, metal contacts 112 are used to form electrical connections between interconnect levels and devices 107 formed in well 108.

In the present invention no distinction is made between "contacts" and "vias" with the term "via" in the present disclosure referring to both contacts and "vias". FIG. 2 shows an overhead view of a portion of an interconnect layer 200. Interconnect layer 200 comprises a plurality of interconnect lines 202 which couple specific metal vias 204 to one another. The individual interconnect lines 202 overlay metal vias 204 and an ILD. The maze-like design or routing of the individual interconnect lines 202 is called the "layout". As would be expected, the layout or placement of individual interconnect lines 202 can be achieved with a variety of different designs. The layout is typically generated by well-known computer aided design techniques. First, design rules are defined. One design rule specifies a minimum distance which must at least exist between any two interconnect lines 202. Another design rule specifies a minimum amount of overlap of vias by overlaying interconnect lines. The specific design rules are generally defined by the manufacturing process utilized. A layout designer attempts to optimize a variety of factors when designing the layout of a specific interconnect level. For example, the interconnect lines 202 are kept as short as possible without adversely effecting the routing of other interconnect lines in the layer. Attempts are also made to prevent routing of interconnect lines in parallel with interconnect lines in layers above and below. The width of the interconnect lines are specified by current carrying requirements with the minimum width of the lines being defined by the process utilized to manufacture the circuit. Vias or contacts are completely covered by respective interconnect lines. It is to be appreciated that although all vias are covered by respective interconnect lines, all vias are not necessarily overlapped. Once the layout has been designed, a mask with the layout or interconnect pattern in it is generated with well-known techniques.

The mask is used along with standard photolithography techniques to form interconnect layer 200 in a semiconductor integrated circuit. First a metal layer, such as aluminum, is blanket deposited over an entire wafer surface. After the metal layer has been formed, a photoresist layer is formed over it. The photoresist layer is then exposed with a mask having the desired interconnect pattern. Those portions of the photoresist layer not covered by the pattern contained in the mask become exposed to light. Portions of the photoresist layer not exposed to light are then developed away, leaving a photoresist pattern which is nearly identical to that which was contained in the mask. Next, the blanket deposited metal layer is etched with an anisotropic etch so that the metal layer becomes patterned with the same pattern as generated in the photoresist, which in turn was generated from the mask.

A problem with the prior art method of laying out an interconnect layer is the amount of via coverage (overlapping) by overlaying interconnect lines. That is, all interconnect lines are designed to cover vias but not necessarily overlap them. For example, as can be seen in FIG. 2, with the prior art layout scheme some vias 204a are overlapped on all four sides. Other vias, for example 204b, are overlapped on three sides and flush with the interconnect line on the fourth. Still other vias, for example 204c, are overlapped on two sides and flush with the interconnect line on two sides. And still other vias, for example 204d, are overlapped on only a single side, and are flush with the interconnect line on the other three. The CAD tool which generates the layout is concerned with optimizing the characteristics listed above and only guarantees that a via will be covered, but not necessarily overlapped. Those vias which are not overlapped on all four sides are more susceptible to reliability and performance (higher resistance) problems in the fabricated integrated circuit. For example, FIG. 3a shows the positioning of an interconnect line 300 over a via 302. Interconnect line 300 is designed to overlap via 302 on three sides but not on the fourth side 303. Due to mask alignment tolerances and/or mask misalignments, the positioning of interconnect line 300 can be shifted in one direction or the other during fabrication of the interconnect layer, as shown in FIG. 3b. If the shift is in a direction away from the side 303 of via 302 which is not overlapped by the interconnect line 300, via 302 will only be partially covered by interconnect line 300.

If the mask is slightly shifted a structure such as shown in FIG. 3c can result. The patterned photoresist layer 304, which is used to mask the metal layer 306, is shifted so that photoresist layer 304 only partially covers metal via 308. As a result, as shown in FIG. 3d, when metal layer 306 is anisotropically etched into individual metal line 307, metal via 308 Can be attacked and entirely or partly etch away. If, due to process marginality, the via is entirely etched away, no electrical connection is made between interconnect lines, resulting in an open circuit and circuit failure. If via 308 is partially etched away, the contact resistance increases because there is less conductor to pass current. An increase in contact resistance will increase the interconnects RC delay which adversely affects circuit performance (i.e. speed). Additionally, a partially etched via is especially troublesome because the circuit may pass all reliability tests yet still fail after testing is complete and the product sold.

Thus, what is needed is a method to improve the coverage of a via or contact by an interconnect line so that potential manufacturing and performance problems are decreased.

SUMMARY OF THE INVENTION

A method of improving via/contact coverage by an interconnect layer of an integrated circuit is described. First a design rule is set (by process developers) which specifies a minimum distance which must exist between individual interconnect lines of the interconnect layer. Next an initial layout of the interconnect layer is generated. An initial layout is generated wherein the individual interconnect lines of the interconnect layer are separated by at least the minimum distance. The overlap of each side of each via by interconnect lines is increased to a first predetermined amount. Next the overlap of each side of each via is checked to determine if increasing the overlap to the first predetermined amount violates a design rule. If a side of a via does violate a design rule, the first predetermine amount of overlap is removed from those sides of those vias which violate the design rule. Next a second, smaller amount of overlap is provided to those sides of those vias which violated the design rule when increased to the first predetermined amount. The second predetermined amount of overlaps are then checked to determine if any of the second, smaller overlaps violate the design rule. If so, those overlaps are removed. The process is continued in this manner until there are no design rule violations.

A goal of the present invention is to provide a simple method of improving via/contact coverage in an integrated circuit.

Another goal of the present invention is to improve via/contact coverage without increasing die size or decreasing circuit complexity.

Still another goal of the present invention is to improve the yield, reliability and performance of an integrated circuit.

BRIEF DESCRIPTION OF THE DRAWINGS

FIG. 1 is an illustration of a cross-sectional view of a multilevel interconnect structure used in an integrated circuit.

FIG. 2 is an illustration of an overhead view of an interconnect layer of an integrated circuit showing individual interconnect lines and vias formed below.

FIG. 3a is an illustration of an overhead view of an interconnect line overlapping a via on three sides and flush with the via on the fourth.

FIG. 3b is an illustration of an overhead view showing the result of misaligned of the interconnect line to the via of FIG. 3a.

FIG. 3c is an illustration of a cross-sectional view showing a photoresist layer for which its mask has been misaligned.

FIG. 3d is an illustration of a cross-sectional view showing the formation of an interconnect line on the substrate of FIG. 3c wherein the via becomes etched.

FIG. 4 is an illustration of an overhead view of the interconnect layer of FIG. 2 after via overlaps have been optimized by the present invention.

FIG. 5 is a flow-diagram illustrating the method of the present invention which optimizes via overlaps by an interconnect layer in an integrated circuit.

FIG. 6a is an illustration of an overhead view showing a via having an unoptimized overlap of a via by an interconnect line.

FIGS. 6b–6f are illustrations showing how via coverage by an interconnect line of an integrated circuit can be optimized after an initial interconnect layout.

DETAILED DESCRIPTION OF THE PRESENT INVENTION

The present invention describes a novel method of improving contact or via coverage by an interconnect line in an integrated circuit without increasing die size or reducing circuit density. In the present invention numerous specific details such as specific design rules, dimensions, and fabrication techniques etc. have been disclosed in order to provide a thorough understanding of the present invention. It will be obvious, however, to one skilled in the art that the present invention may be practiced without these specific details. In other instances, well-known interconnect layout methods and designed choices have not been described in detail in order to not unnecessarily obscure the present invention.

FIG. 4 shows the result of the present invention. FIG. 4 shows the interconnect layer of FIG. 2 after via coverage or via overlap has been optimized by the method of the present invention. The shaded areas 402 surrounding vias 406 represent area added to the interconnect lines 404 as a result of the via overlap optimization process of the present invention. As can be seen in FIG. 4, most via sides which previously had very little or no overlap have now been optimized to include additional overlap wherever possible. That is, the widths of interconnect lines 404 over vias 406 have been increased, wherever possible, to help insure that when the interconnect lines are actually fabricated they sufficiently overlap the vias formed below. In this way mask alignment tolerances and process variations do not result in partially etched vias, as shown in FIG. 3d. It is to be appreciated that the method of the present invention optimizes the amount of via overlap without increasing die size or decreasing circuit density. Additionally, the overall layout of the interconnect layer is pot substantially altered.

FIG. 5 is a flowchart which illustrates the method of the present invention used to optimize interconnect line coverage of vias. The method of the present invention is described in relation to the optimization of contact coverage by a first interconnect level. The first step, as detailed in block 502, is to generate an initial layout of the interconnect layer with well-known techniques. The first step in generating the initial layout is to set design rules. A design rule which specifies the minimum distance that must exist between individual interconnect lines of an interconnect layer is set. In the present invention a 0.8 μm line separation design rule is utilized. (It is to be appreciated that the minimum line separation design rule can be any distance which meets one's specific requirements and process capabilities.) A design rule which defines the minimum amount of overlap of vias/contacts which must be provided during the initial layout should also be set. For contact overlap a zero overlap design rule is used. A zero overlap design rule means interconnect lines cover vias/contacts, but do not necessarily overlap them (i.e. sides of interconnect lines can be flush with sides of vias). It is to be noted that all vias can be given some overlap during the initial layout if desired. For example, higher levels of metalization (i.e. metal 2 and metal 3) generally provide some initial amount of overlap (~0.2 μm) of vias. The design of the interconnect layer is such that interconnect lines are kept as short as possible without adversely effecting the routing of other interconnect lines. A computer aided design (CAD) tool is generally used by designers to aid in generating the initial layout. A layout, such as shown in FIG. 2, is generated during the initial layout. The initial layout is made without violating any of the set design rules (i.e. all interconnect lines are spaced apart by at least 0.8 μm and all vias (contacts) are covered by interconnect lines but are not necessarily overlapped.)

After the initial layout of the interconnect layer, the overlaps of all vias by interconnect lines are optimized. It is to be appreciated that even if some amount of overlap of vias is initially provided during the initial layout (i.e. as in the case of metals 2 and 3), the process of the present invention is still very useful in that it can increase the amount of overlap of each via wherever possible. In this way a greater amount of error is provided for during fabrication. The first step in optimizing the via overlap as specified in block 504 is to provide a first amount of overlap to all sides of all vias which were initially not provided with at least the first amount of overlap. For contact coverage, a 0.3 micron overlap of each via (contact) has been found to be a good starting point for optimizing contact overlap.

By way of example, FIG. 6a shows a via 604 covered by an interconnect line 602. After initial layout, sides A, B, and C of via/contact 604 are flush with interconnect 602. No overlap was provided during the initial layout. Presently interconnect line 602 is spaced apart from interconnect line 606 by 0.8 μm, from interconnect line 608 by 1.0 μm, and from interconnect line 610 by 1.1 μm. As shown in FIG. 6b, the area of the interconnect line 602 over via 604 is enlarged to provide the first amount of overlap 620, 0.3 μm, on each side of via 604. The sides of all vias coupled to the interconnect layer are provided with the first amount of overlap at this time. (It is to be appreciated that if a side of a via already has an overlap greater than or equal to the first amount of overlap provided, no additional overlap is provided to that side.) Additionally, it is to be appreciated that the provided first amount of overlap (0.3 μm) is quite arbitrary and can be any amount that optimizes ones design. Factors which may help in selecting a first amount of overlap are process technology to be utilized, design rules, amount of overlap initially provided, and fabrication margins.

Next, as specified in block 506, each added overlap of each via is checked to determined if there has been a design rule violation. For example, as shown in FIG. 6b, the overlap 620 is checked to see if it violates the 0.8 μm minimum distance design rule. Since overlap 620a is separated from interconnect line 606 by only 0.5 μm, it violates a design rule. Since overlap 620b is separated from interconnect line 608 by only 0.7 μm it also violates a design rule. Since overlap 620c is separated from interconnect 610 by at least 0.8 μm it does not violate a design rule. A similar check is made of all vias which have had their overlaps extended to the first amount.

Because there was a design rule violation we go to block 510 from decision block 508. So, as specified by block 510, the first added overlap of each violating side of each via is reduced by a given amount to a second, smaller overlap. Those added overlaps which do not violate a design rule are not reduced by the given amount. In the present invention a reduction of approximately 0.1 μm has been found sufficient, however, again, this number is quite arbitrary. (It is to be appreciated that the overlap of a side of a via is never reduced to an amount less than that which was originally provided by the initial layout.) So as shown in FIG. 6c, the overlaps 620a and 620b of sides A and B of via 604, respectively, are reduced by 0.1 μm to overlaps 622a and 622b which are 0.2 μm. A similar reduction is made at this time to all overlaps of all vias which violate a design rule.

Next, as specified by block 506, all of the second added overlaps are checked to determine if there is a design rule violation. For example, overlaps 622a and 622b are checked to see if they violate a design rule. Since overlap 622a is separated from interconnect line 606 by only 0.6 μm it violates a design rule. Since 622b is separated from interconnect line 608 by 0.8 μm it no longer violates a design rule. Since overlap 622a violated a design rule we once again proceed to block 510 from decision block 508.

Next, as specified by block 510, the second added overlap 622a is reduced once again by the predetermined amount of 0.1 μm. This provides a third smaller overlap of 0.1 μm. So, as shown in FIG. 6d, an overleap 624a of 0.1 μm on side A of via 604 is generated. A similar reduction is made to all second overlaps of all vias which violate the design rule. Next, as specified by block 508, all of the third overlaps, for example, 624a of via 604, are checked to see if any violate a design rule. Because overlap 624a is separated from interconnect line 606 by only 0.7 μm, it violates a design rule.

Because a third overlap violates a design rule, we once again proceed to block 512 from decision block 510. Each of the violating third overlaps is reduced by 0.1 μm. Such a reduction removes all of the added overlaps. For example, as shown in FIG. 6e, the overlap of side A is once again reduced by 0.1 μm. This removes all the previously added overlap so that interconnect line 602 is aligned flush with side A of via 604. The design rules are once again checked, and this time side A is in compliance. It is to be noted that no overlap was added to side A of via 604 because interconnect line 602 and interconnect line 606 were spaced apart during the initial layout by the minimum distance allowed by design rules.

Because no design rules are now violated, the optimized overlaps are now added to the respective interconnect lines. For example, overlaps 622b, 620c, and 620d are added to the interconnect line 602 as shown in FIG. 6f to generate an interconnect with an increased area 630. Although an overlap has not been added to all sides of via 604, statistically the via has a lower probability of performance degradation or failure.

It is to be appreciated that although the present invention has been described with respect to a specific interconnect layer (metal 1) having a minimum line separation design rule (0.8 μm), a specific overlap design rule (zero), and addition of a specific amount of overlap (0.3 μm) which is reduced by a given amount (0.1 μm) upon each rule violation, the resent invention is not intended to be limited to these specific distances, dimensions or interconnect layers. Additionally, the teachings of the present invention am equally applicable to other shapes of vias (i.e. circular or rectangular vias, etc.) Additionally, although up to three different sizes of overlaps are tried in the present invention, many more sizes can be used. The more sizes tried, the more vias that will be fixed to some degree. Additionally, it is to be appreciated that depending upon the design of the initial layout, some, all, or none of the vias will be able to be provided with increased overlaps. What is important is to add or increase the overlap of as many vias as possible so that statistically them will be fewer "failures". It has been found that by using the specific dimensions described above, approximately 90% of all vias are fixed to some degree (i.e. 90% of all vias are given some overlap which was not initially provided). The more vias fixed, the fewer potential failures later.

In conclusion, the present invention improves the coverage of vias by overlaying interconnect lines. First, an initial layout of the interconnect layer is generated using standard layout techniques. Then, after the initial layout, via coverage is optimized wherever possible. The present invention increases reliability and performance without altering die size or decreasing circuit complexity.

Thus, a novel method of improving via/contact coverage in an integrated circuit has been described.

We claim:

1. A method of improving via coverage by an interconnect layer of an integrated circuit comprising the steps of:

setting a design rule which specifies a minimum distance which must exist between interconnect lines of said interconnect layer;

generating an initial layout of said interconnect layer wherein said individual interconnect lines of said interconnect layer couple vias to one another and wherein said individual interconnect lines are separated by at least said minimum distance;

locating the position of a via to be coupled to one of said interconnect lines of said interconnect layer;

increasing to a first amount the amount of overlap of each side of said via by said interconnect line;

checking whether increasing said overlap of each side of said via to said first amount violates said design rule; and removing said first amount of overlap from those sides which violate said design rule.

2. The method of claim 1 further comprising the steps of:

increasing the amount of overlap of each side of said via which violated said design rule when increased to said first amount, said overlap increased to a second amount wherein said second amount is less than said first amount;

checking whether increasing said overlap of said via to said second amount violates said design rule;

removing said second amount of overlap from those sides which violate said design rule.

3. The process of claim 2 further comprising the steps of:

increasing the amount of overlap of each side of said via which violated said design rule when increased to said second amount, said overlap increased to a third amount wherein said third predetermined amount is less than said second amount;

checking whether increasing said overlap of said via to said third predetermined amount violates said design rule; and removing said third added overlap from those sides which violate said design rule.

4. The process of claim 1 wherein said minimum distance is 0.8 μm.

5. The process of claim 1 wherein said first amount is 0.3 μm.

6. The method of claim 2 wherein said second amount is 0.2 μm.

7. The method of claim 3 wherein said third amount is 0.1 μm.

* * * * *

UNITED STATES PATENT AND TRADEMARK OFFICE
CERTIFICATE OF CORRECTION

PATENT NO. : 5,620,916
DATED : April 15, 1997
INVENTOR(S) : Eden et al.

It is certified that error appears in the above-identified patent and that said Letters Patent is hereby corrected as shown below:

In column 4 at line 30 delete "pot" and insert --not--

In column 6 at line 4 delete "overleap" and insert --overlap--

In column 6 at line 38 delete "resent" and insert --present--

In column 6 at line 40 delete "am" and insert --are--

In column 6 at line 50 delete "them" and insert --there--

Signed and Sealed this

Twenty-sixth Day of August, 1997

Attest:

BRUCE LEHMAN

Attesting Officer

Commissioner of Patents and Trademarks